United States Patent [19]

Cresswell et al.

[11] 4,204,116
[45] May 20, 1980

[54] LIGHT ACTIVATED SWITCH SYSTEM HAVING HIGH DI/DT CAPABILITY

[75] Inventors: Michael W. Cresswell, Plum Borough; Richard J. Fiedor, Penn Hills, both of Pa.

[73] Assignee: Westinghouse Electric Corp., Pittsburgh, Pa.

[21] Appl. No.: 927,441

[22] Filed: Jul. 24, 1978

[51] Int. Cl.² .............................................. G01D 5/34
[52] U.S. Cl. .................................... 250/229; 350/355
[58] Field of Search ............... 350/355, 356, 357, 358; 250/229, 551, 201

[56] References Cited
U.S. PATENT DOCUMENTS 3,513,323  5/1970  Sincerbox et al. .
3,772,612  11/1973  Gange .
3,883,220  5/1975  Taylor .
3,894,792  7/1975  Komatsubara et al. .
4,019,159  4/1977  Hon et al. ............................... 350/356
4,119,845  10/1978  Jaskolski ................................ 250/229

Primary Examiner—David C. Nelms
Attorney, Agent, or Firm—B. W. McGee

[57] ABSTRACT

A light activated semiconductor switch comprises a light source for activating a light activated semiconductor device. A remote controllable light deflecting device is interposed between the light activated device and the light source for directing the light source onto the light activated device at a specified time in the rise time of the light source in response to a signal in order to decrease the switching time of the light activated device.

6 Claims, 6 Drawing Figures

LIGHT ACTIVATED SWITCH SYSTEM HAVING HIGH DI/DT CAPABILITY

BACKGROUND OF THE INVENTION

1. Field of the Invention

This invention relates to a light activated switch system and more particularly to a light activated switch system using a semiconductor controlled rectifier as a switch.

2. Description of the Prior Art

In the operation of a conventional light activated silicon switch (LASS), the di/dt capability i.e., the rate of current increase or "turn on" as a function of time, which can be delivered to a load depends, inter alia, on the rate of rise of the intensity of light impinging on the LASS. The di/dt capability of a particular LASS is a major restriction on performance and many methods have been proposed to remedy the problem including external circuits for limiting the current rise on switching of the LASS. However, external circuits cause power losses and time lags.

In order to initiate switching anywhere across the conducting area of the switch, the light intensity impinging thereon must exceed some minimum value $I_o$. This value is determined by the current level provided by optically excited charge carriers. The current level must be sufficient to sustain regenerative injection of minority carriers by the applied voltage if the device is to remain "ON" after illumination terminates. The difficulty is that only a small portion of the device is responsive to the light activation and initially switches to the conducting state. The device is dependent on carrier diffusion to "turn on" the remainder of the active region, which requires substantial time. Meanwhile, on "turn on" the voltage across the device drops instantaneously to about 10% of the blocking state value. Thus, the current is shunted through the portions of filaments of the device in the conducting state, causing a very high current density and fusion of the device.

The di/dt capability, or more accurately the switching time characteristic of the device, can be improved by using light sources having a very fast rise time (short rise period) such as Nd lasers, to impinge on the switch causing efficient switching and preventing a large amount of power from dissipating in the switch and burning it out. However, lasers and many other light sources having fast rise times are expensive to build and to operate.

The present invention provides a light activated switch system capable of fast switching times using conventional light sources and LASS and wherein the intensity and rise time of the light source is non-critical.

SUMMARY OF THE INVENTION

A light activated switch system comprising a light activated switch, for example, a semiconductor thyristor having a switching time sometimes called di/dt capability and a light source having a rise time for directing light thereon. A controlled light deflecting device is interposed between the light source and the light activated switch. A load is coupled to one end of the light activated switch and a pulse forming network is coupled to the other end.

In response to an appropriate signal, the light deflecting device directs light onto the light activated switch in order to close it. A current pulse generated by the pulse forming network is then applied to the load through the light activated switch. In another embodiment, the light is turned on in response to an appropriate signal and the light deflecting device directs light onto the light activated switch at a specified time in the rise period of the light intensity in response to another signal.

DESCRIPTION OF THE PREFERRED EMBODIMENT

Figure 1:
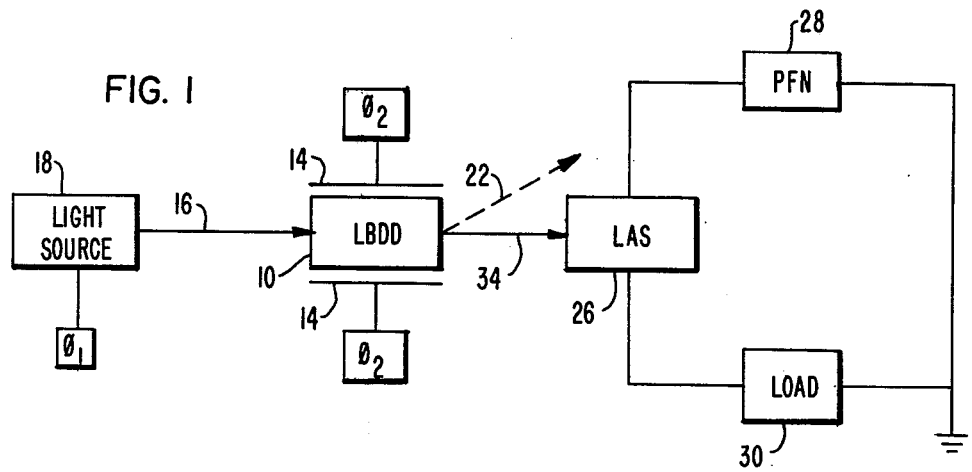
FIG. 1 is a schematic block diagram of a preferred embodiment of a light activated switch system according to the present invention.

FIG. 1 is a block diagram of a preferred embodiment of a light activated switch system according to the teachings of the present invention. A light beam deflection device (LBDD) 10 is responsive to deflection control means 14 for deflecting a light beam 16 emitted from a source of light 18. The deflected light beam 22 emerges from the LBDD 10 and is directed thereby away from a light activated switch (LAS) 26 such that no amount of the deflected light 22 impinges upon the LAS 26. The LAS 26 is coupled between a pulse forming network (PFN) 28 and a load 30 for closing the circuit and delivering a current pulse formed by the PFN 28 to the load 30 in response to a light 34 impinging upon the LAS 26. The light beam 34 is the undeflected light beam emerging from the LBDD 10. The LBDD 10 is only an illustrative example of means by which the light beam 16 can be prevented from impinging upon the LAS 26 until the specified time in the rise period of the light source 18. The scope of the invention is not limited by this example, however, and any device which functions to controllably prevent the light beam 16 from impinging upon the LAS 26 is included within the scope and spirit of the teachings of the present invention.

Figure 2:
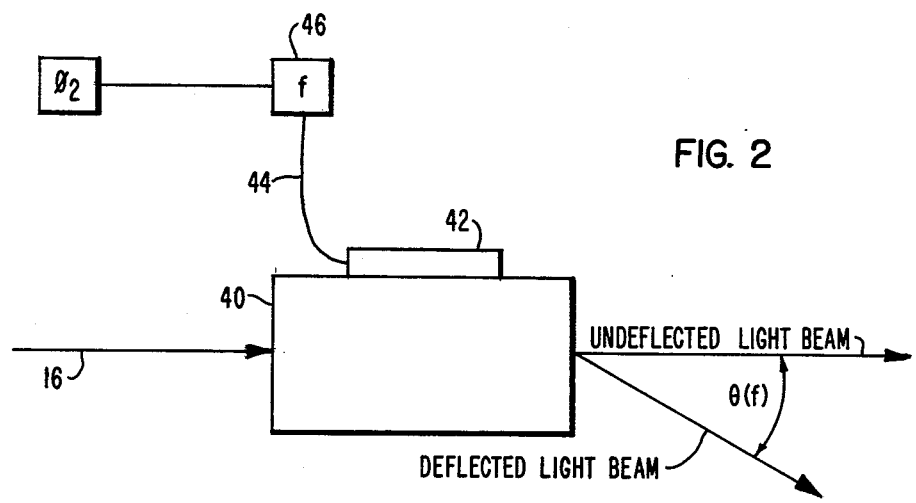
FIG. 2 shows a light beam deflection device suitable for use in the light activated switch system of FIG. 1.

A light beam deflection device suitable for use in the light activated switch system of the present invention is shown in FIG. 2 wherein a deflection device 40 deflects the beam of light 16 by an angle $\theta$. The deflection device 40 can be comprised of any acousto optic material, for example, capable of deflecting a beam of light at varying angles as a function of sound frequency such as fused quartz $As_2S_3$, or GaAs. A transducer 42 is coupled to a surface of the deflection device 40 and is responsive to a sound frequency generator 46 for controlling the angle $\theta$ of deflection of the light beam in response to the signal $\phi_2$.

Figure 3:
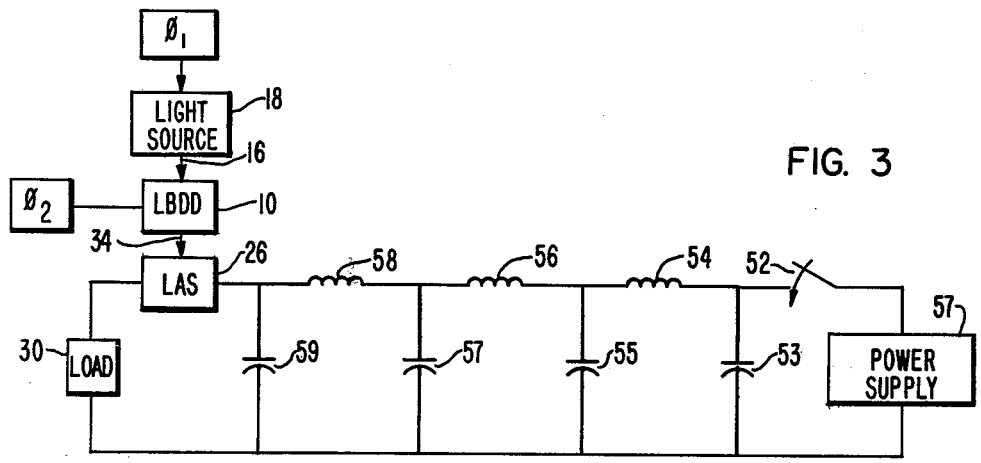
FIG. 3 shows a pulse forming network suitable for use in the light activated switch system of FIG. 1.

A pulse forming network such as is typically used in conjunction with the light activated switch system of the present invention is shown in FIG. 3 wherein a power supply 51 is coupled to a ladder network via a switch 52. The ladder network consists of inductors 54, 56 and 58 and capacitors 53, 55, 57 and 59. When the switch 52 closes, the network charges with current from the power supply 51. The switch 52 is opened and the current remains in the network available to be delivered to the load 30.

A light activated switch suitable for use in the light activated switch system of the present invention is described in U.S. Pat. No. 3,590,344 issued June 29, 1971 and assigned to the assignee of the present invention wherein a light activated controlled rectifier is disclosed having a body including four alternate regions of opposite conductivity. The light enters at one major surface of the body and passes entirely through the body to the opposed major surface where reflective means causes the light to pass back through the body.

Figure 4:
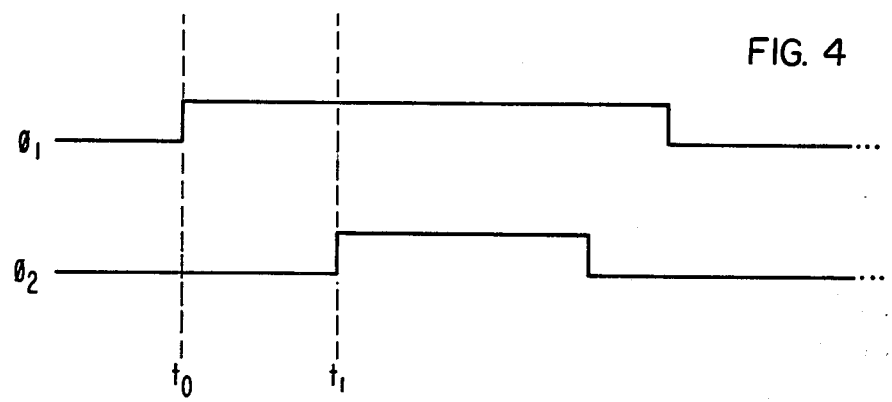
FIG. 4 shows timing diagrams corresponding to signals applied to similarly referenced elements in FIG. 1.
Figure 5:
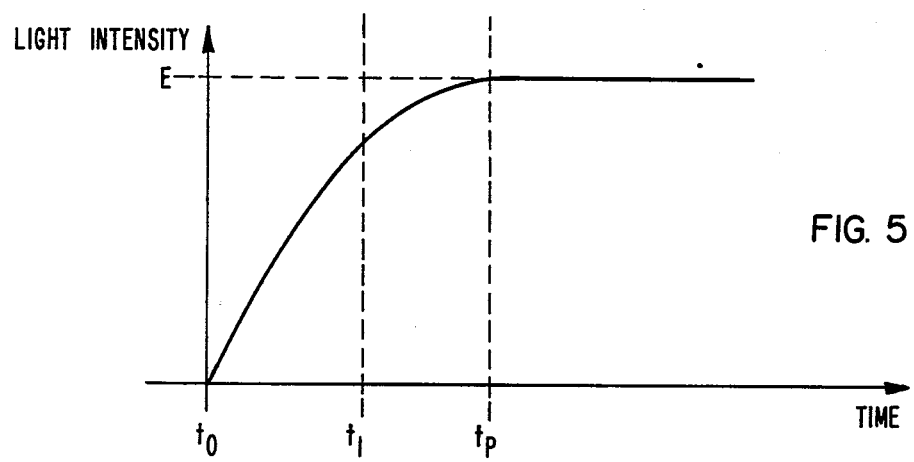
FIG. 5 is a graph of a typical rise period of the light source shown in FIG. 1.

The timing diagram of FIG. 4 will be used to describe the operation of the light activated switch system of the present invention. The timing diagrams designated in FIG. 4 correspond to signals applied to similarly referenced elements in FIG. 1. At a time $t_o$, a certain event occurs and it is desired to deliver a current pulse formed by the PFN 28 to the load 30 through the LAS 26. A signal $\phi_1$ is applied to the light source 18 as shown in FIG. 4 by the timing diagram $\phi_1$ and the light source 28 is turned on. A period of time lapses before the light source 18 reaches its full intensity. This period of time is called the rise period. FIG. 5 graphically illustrates the rise period of the light source 18 wherein the time period from $t_o$ to $t_p$ is the rise period. The light source 18 can be a conventional incandescent light bulb having a rise period $t_p$ equal to approximately 1 millisecond or it can be a more complex source of light having a much faster rise period, for example, a laser device. However, as subsequently discussed, the rise period of the light source 18 is an insignificant parameter thereof in reference to the light activated switch system of the present invention so long as the final intensity E of the light source 18 is at least as bright as the minimum intensity required to trigger the LAS 26 into conduction.

Figure 6:
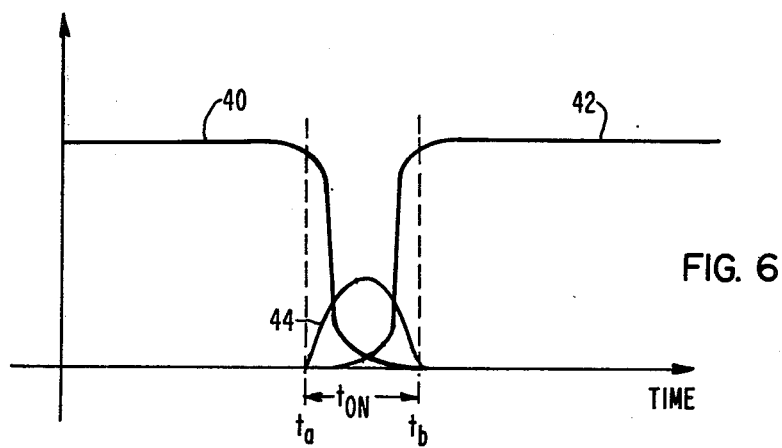
FIG. 6 shows a graph of the ideal voltage and current curves of the switch shown in FIG. 1.

At a time $t_1$ in the rise period of the light source 18 as shown in FIG. 5, a signal $\phi_2$ is applied to the LBDD 10 in order to direct the light source emerging therefrom onto the LAS 26. The LAS 26 sees only the very fast rise in intensity of the light source 18 from the time periods $t_1$ to $t_p$ and, accordingly, the switching in the LAS 26 takes place much faster than if the LAS 26 were exposed to the total rise period of the light source 18 from $t_o$ to $t_p$. The operation of the LAS 26 under these conditions approaches the operation of an ideal switch as graphically illustrated in FIG. 6. FIG. 6 shows the operation of an ideal semiconductor switch wherein at a time $t_a$ the switch begins to turn on. The voltage thereacross represented by a curve 40 drops rapids as the current therethrough rises rapidly as represented by a curve 42. At a time $t_p$, the switch is completely closed expending a total switching time $t_{on}$. The power dissipated in the switching operation is represented by a curve 44. It will be understood that the time $t_1$ is a design consideration and is a function, inter alia, of the current level passing through the LAS 26 from the PFN 28, the switching time characteristic (di/dt capability) of the LAS 26, the minimum intensity required to fire the LAS 26, and the rise period of the light source 18. As can be induced from the FIG. 6, a long switching time $t_{on}$ wherein the voltage represented by the curve 40 falls slowly and the current through the switch represented by the curve 42 rises slowly causing the voltage and current curves to increasingly overlap and the power dissipated in the switch represented by the curve 44 becomes very large. The very fast switching time of the LAS 26 according to the teachings of the present invention avoid this catastrophe.

In a second mode of operation, the light source 18 may be continously on. At the occurrence of the certain event, the signal $\phi_2$ is applied to the LBDD 10 in order to direct the light source emerging therefrom onto the LAS 26.

A feature of the present invention is that the LAS 26 will remain closed until the light beam 16 is again deflected therefrom by removal of the signal $\phi_2$ for example, at a time $t_2$ as shown in FIG. 4.

It will be appreciated by those skilled in the art that the present invention may be carried out in various ways and may take forms and embodiments other than the illustrative embodiments heretofore described.

What we claim is:

1. A light activated switch system comprising:
   (a) a light activated switch;
   (b) a source of light having a rise period; and
   (c) means for directing said source of light onto said light activated switch at a specified time in the rise period of said source of light in response to a signal.

2. A light activated switch system comprising:
   (a) a light activated switch;
   (b) means for producing light of predetermined intensity in response to a first signal, said intensity of light having a rise period, said light activated switch having a switching time characteristic varying in direct relationship with said rise time; and
   (b) deflecting means between said means for producing an intensity of light and said light activated device for directing said light means onto said light activated switch at a predetermined time in the rise period of said light in response to a second signal.

3. A light activated switch system including a light activated semiconductor switch having a predetermined switching time characteristic, said light activated switch system comprising:
   (a) means for producing an intensity of light in response to a first signal said intensity of light having a rise period;
   (b) deflecting means between said means for producing an intensity of light and light activated semiconductor switch controllable for directing said intensity of light onto said light activated semiconductor device at a specified time in the rise period of said intensity of light in response to a second signal for decreasing the switching time characteristic of said light activated semiconductor switch.

4. A light activated switch system comprising:
   (a) a light activated semiconductor switch, having a switching time characteristic;
   (b) means for producing a predetermined intensity of light in response to a first signal, said intensity of light having a rise period;
   (c) deflecting means between said means for producing said predetermined intensity of light and said light activated semiconductor switch controllable for directing said intensity of light onto said light activated semiconductor switch at a specified time in the rise period of said intensity of light in response to a second signal.

5. A light activated switch system including a light activated semiconductor switch for delivering electrical current to a load, said semiconductor switch having a predetermined switching time characteristic, said switch system comprising:

(a) a pulse forming circuit for generating said electrical current coupled to said load for delivering thereto a current pulse representative of said current;

(b) means for producing a predetermined intensity of light in response to a first signal, said intensity of light having a rise period;

(c) said light activated semiconductor switch between said load and said pulse forming circuit responsive to said means for producing an intensity of light for applying said current pulse to said load; and (d) deflecting means between said means for producing an intensity of light and said light activated switch controllable for directing said intensity of light onto said light activated switch at a specified time in the rise period of said intensity of light in response to a second signal for decreasing the switching time characteristic of said light activated switch.

6. A light activated switch system comprising:
(a) a pulse forming circuit including:

a power supply;
a ladder network including at least one capacitor coupled to at least one inductor;
switch means for coupling said power supply and said ladder network in response to a first signal for generating a current in said network;

(b) a load;

(c) means for producing an incandescent light in response to a second signal, said incandescent light having a rise period;

(d) a light activated semiconductor controlled rectifier between said load and said pulse forming circuit responsive to said incandescent light for delivering said current to said load, said rectifier having a switching time characteristic;

(e) deflecting means between said incandescent light and said rectifier remotely controllable for directing said incandescent light onto said rectifier at a specified time in the rise period of said incandescent light in response to a third signal for decreasing the switching time characteristic of said light activated switch.

* * * * *